US009184282B2

(12) United States Patent
Huang et al.

(10) Patent No.: US 9,184,282 B2
(45) Date of Patent: Nov. 10, 2015

(54) ULTRA-HIGH VOLTAGE LATERALLY-DIFFUSED MOS DEVICES AND METHODS OF FORMING THE SAME

(71) Applicant: Taiwan Semiconductor Manufacturing Company, Ltd., Hsin-Chu (TW)

(72) Inventors: Tzu-Ming Huang, New Taipei (TW);
Chia-Chia Kan, Taipei (TW);
Shen-Ping Wang, Keelung (TW);
Lieh-Chuan Chen, Hsinchu (TW);
Po-Tao Chu, New Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 158 days.

(21) Appl. No.: 13/963,658

(22) Filed: Aug. 9, 2013

(65) Prior Publication Data

US 2015/0041891 A1    Feb. 12, 2015

(51) Int. Cl.
*H01L 29/66*    (2006.01)
*H01L 29/78*    (2006.01)
*H01L 29/10*    (2006.01)

(52) U.S. Cl.
CPC ........ *H01L 29/7816* (2013.01); *H01L 29/1045* (2013.01); *H01L 29/66681* (2013.01); *H01L 29/7824* (2013.01); *H01L 29/66613* (2013.01); *H01L 29/66636* (2013.01)

(58) Field of Classification Search
CPC ..................... H01L 29/66681; H01L 29/7816; H01L 29/7824; H01L 29/66636; H01L 29/66613
See application file for complete search history.

(56) References Cited

U.S. PATENT DOCUMENTS

| | | | | |
|---|---|---|---|---|
| 6,331,470 | B1 * | 12/2001 | Sanfilippo et al. | 438/311 |
| 2006/0033155 | A1 * | 2/2006 | Wu et al. | 257/335 |
| 2009/0256212 | A1 * | 10/2009 | Denison et al. | 257/408 |
| 2010/0301413 | A1 * | 12/2010 | You | 257/343 |
| 2013/0069712 | A1 * | 3/2013 | Trajkovic et al. | 327/537 |

* cited by examiner

*Primary Examiner* — Ha Tran T Nguyen
*Assistant Examiner* — Aaron Dehne
(74) *Attorney, Agent, or Firm* — Slater & Matsil, L.L.P.

(57) ABSTRACT

Embodiments for the present disclosure include a semiconductor device, an ultra-high voltage (UHV) laterally-diffused metal-oxide-semiconductor (LDMOS) transistor, and methods of forming the same. An embodiment includes a first well region of a first conductivity type in a top surface of a substrate, and a second well region of a second conductivity type in the top surface of the substrate. The second well region laterally separated from the first well region by a portion of the substrate. The embodiment further includes a third region of the second conductivity type in the first well region, and a first field oxide region in the first well region, a second field oxide region in the second well region, the second field oxide region having a second bottom surface, and the first field oxide region having a first bottom surface lower than the second bottom surface and on and directly contacting the third region.

20 Claims, 5 Drawing Sheets

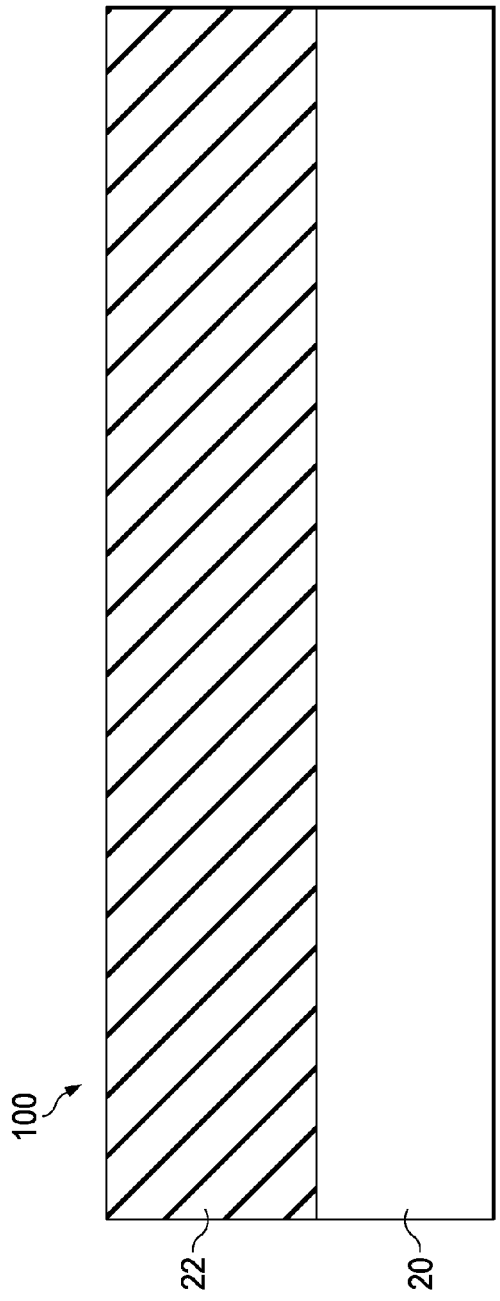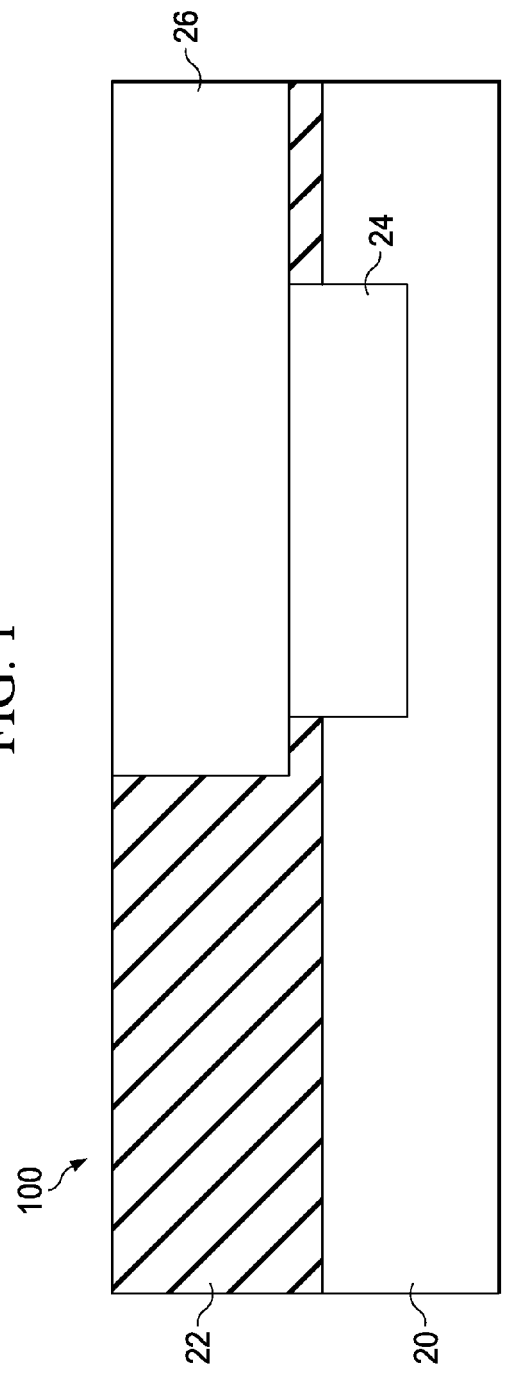

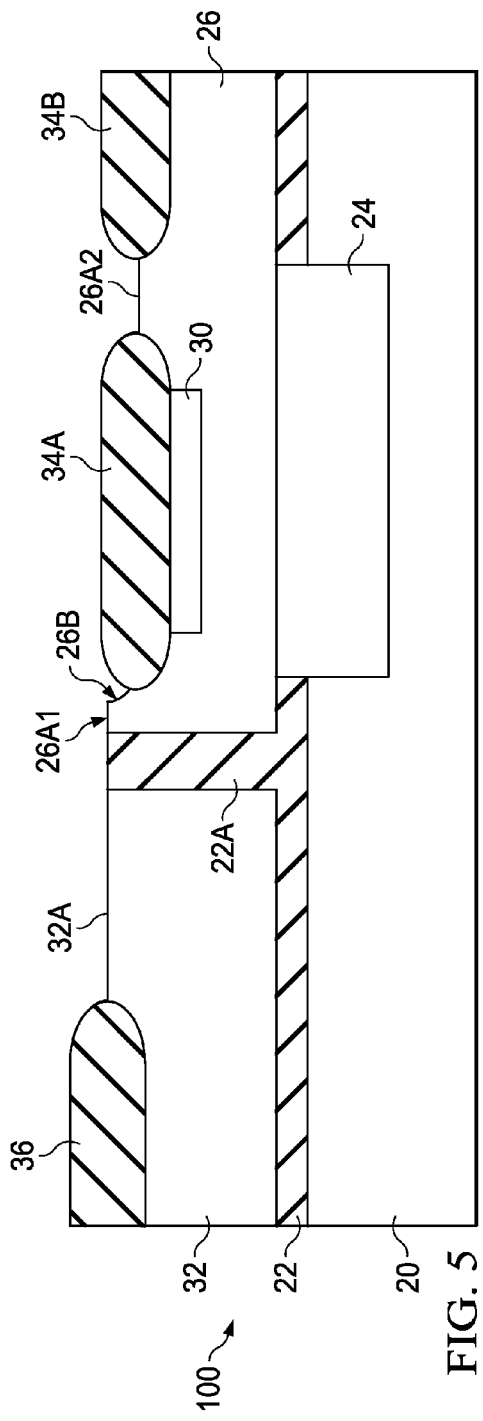
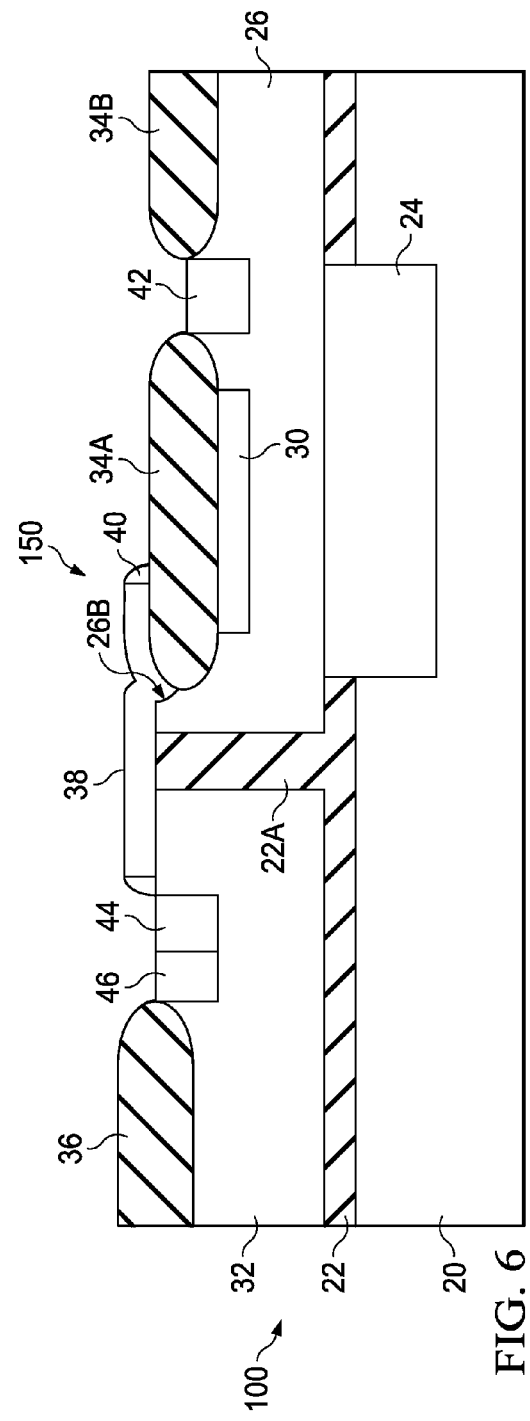

US 9,184,282 B2

ULTRA-HIGH VOLTAGE LATERALLY-DIFFUSED MOS DEVICES AND METHODS OF FORMING THE SAME

BACKGROUND

High voltage MOS transistors are semiconductor devices that can operate with high terminal voltages. High-voltage integrated circuits (ICs) that include high voltage MOS transistors are widely used in applications for the automobile industry, display drivers, portable telecommunication devices, medical equipment, and other areas. As an example, high voltage (e.g., greater than 20 volts) MOS transistors are integrated into a gate driver IC to deliver display signals to a liquid crystal display (LCD) panel. However, with the continuous process shrinking in advanced technology, breakdown voltages of these high voltage MOS transistors are also reduced.

The breakdown phenomena generally escalate as the space between the source and drain regions continues to narrow in MOS transistors made by advanced processing technology, stemming from increased electric fields in the channel region. Known breakdown mechanisms in an MOS transistor include junction breakdown, punch through breakdown, and snapback breakdown. As an example, snapback breakdown occurs near the drain region in an NMOS transistor during saturated operation (e.g., the transistor is turned on). When a voltage is applied on the drain, a lateral electric field is presented in the channel region of the transistor and a peak electric field occurs near the drain region. The high electric field accelerates the electrons in the channel region and causes the electrons to gain enough kinetic energy to become "hot" near the edge of the N+ drain region. The "hot" electrons cause impact ionization of materials near the drain edge and create electron-hole pairs. Electrons will inject into the gate oxide, and some of the injected electrons may become trapped in the gate oxide layer. This so-called hot carrier effect may cause various problems in a MOS transistor. The trapped electrons may cause the threshold voltage (Vt) of an NMOS transistor to undergo an undesirable shift to the positive side. The hot carrier effect may also lead to long term device degradation and reduced reliability. Under extreme circumstances, snapback breakdown may even cause permanent physical damage in the gate oxide.

BRIEF DESCRIPTION OF THE DRAWINGS

For a more complete understanding of the present embodiments, and the advantages thereof, reference is now made to the following descriptions taken in conjunction with the accompanying drawings, in which:

FIGS. 1 through 6 illustrate cross-sectional views of intermediate stages in the manufacturing of a semiconductor device according to an embodiment;

DETAILED DESCRIPTION OF ILLUSTRATIVE EMBODIMENTS

Figure 3:
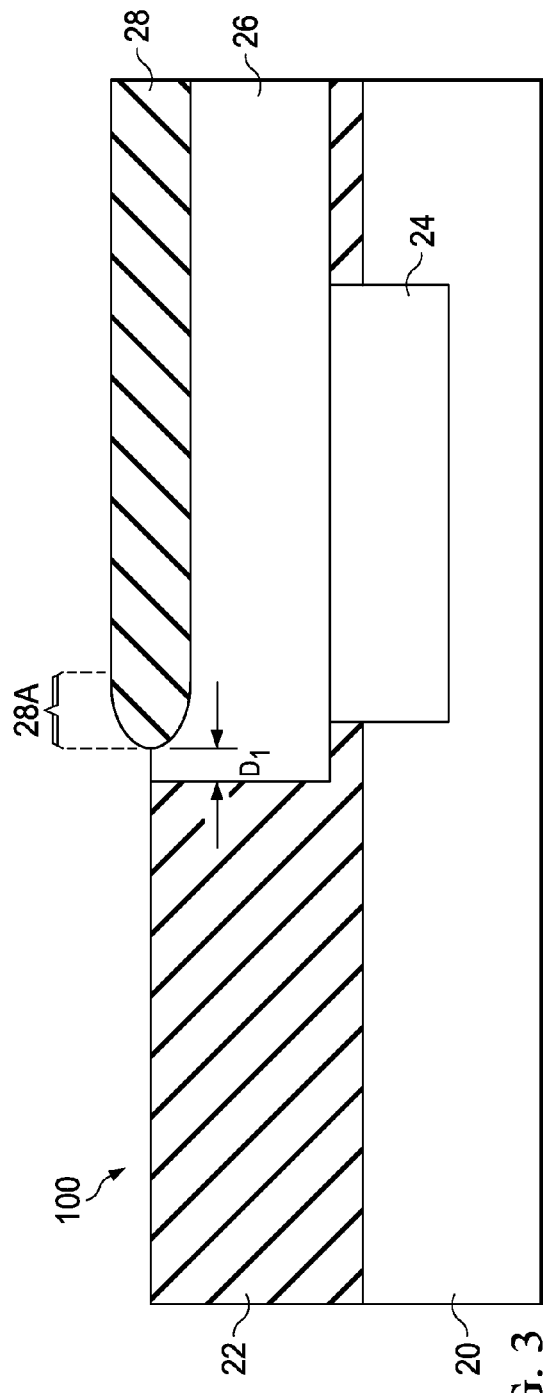

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Embodiments will be described with respect to a specific context, namely an ultra-high voltage (UHV) laterally-diffused metal-oxide-semiconductor (LDMOS) device with a large P-N junction curvature under the gate. Other embodiments may also be applied, however, to other MOS devices with various configurations to improve their breakdown voltage.

Figure 7:
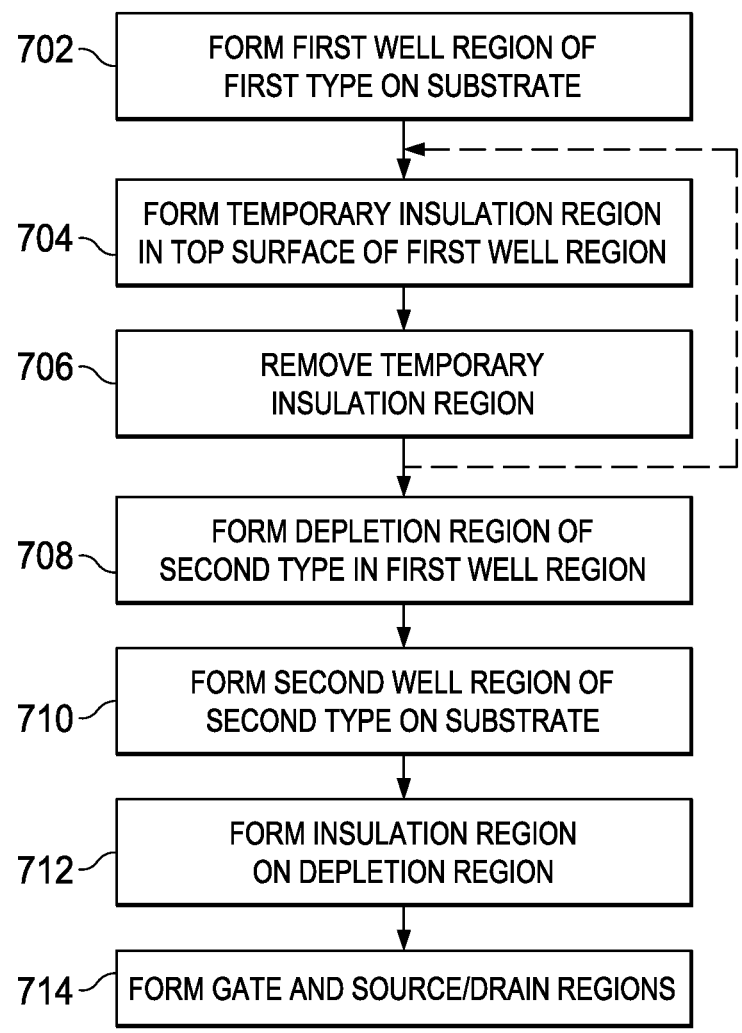
FIG. 7 illustrates a process flow of the process illustrated in FIGS. 1 through 6 according to an embodiment.

FIGS. 1 through 6 are cross-sectional views of intermediate stages in the manufacturing of a semiconductor device according to an embodiment, and FIG. 7 is a process flow of the process shown in FIGS. 1 through 6.

With reference now to FIG. 1, there is shown a semiconductor device 100 including a substrate 20 and a semiconductor layer 22 on the substrate 20. The substrate 20 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 20 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof.

The substrate 20 may include active and passive devices (not shown in FIG. 1). As one of ordinary skill in the art will recognize, a wide variety of devices such as transistors, capacitors, resistors, combinations of these, and the like may be used to generate the structural and functional requirements of the semiconductor device. The devices may be formed using any suitable methods. Only a portion of the substrate 20 is illustrated in the figures, as this is sufficient to fully describe the illustrative embodiments.

The substrate 20 may also include metallization layers (not shown). The metallization layers may be formed over the active and passive devices and are designed to connect the various devices to form functional circuitry. The metallization layers may be formed of alternating layers of dielectric (e.g., low-k dielectric material) and conductive material (e.g., copper) and may be formed through any suitable process (such as deposition, damascene, dual damascene, or the like).

The semiconductor layer 22 may be formed of semiconductor material such as silicon, germanium, silicon germanium, or the like. The semiconductor layer 22 may be doped through an implantation process to introduce p-type or n-type impurities into the semiconductor layer 22. The n-type dopants may be phosphorous, arsenic, nitrogen, antimony, the like, or a combination thereof. The p-type dopants may be boron, gallium, aluminum, indium, the like, or a combination thereof. In an embodiment, the semiconductor layer 22 is epitaxially grown on the substrate 20. In this embodiment, the semiconductor layer 22 may be doped either through an implantation method as discussed above, or else by in-situ doping as the material is grown.

FIG. 2 illustrates the formation of a deep well region 24 and a first well region 26 (step 702) over the deep well region 24. The deep well region 24 may be formed by masking the semiconductor layer 22, for example, with a photoresist (not shown), and performing an implantation process to form the deep well region 24. The deep well region 24 may be doped with p-type or n-type impurities. In an embodiment, a drive-in process, such as a thermal drive-in process is performed to so that the deep well region 24 is formed below the surface of the semiconductor layer 22. In another embodiment, the deep well region 24 may be formed in the substrate 20 before the semiconductor layer 22 is formed over the deep well region 24.

The first well region 26 is formed over the deep well region 24. The first well region 26 may be formed by masking the semiconductor layer 22, for example, with a photoresist (not shown), and performing an implantation process to form the first well region 26. The first well region 26 may be doped with p-type or n-type impurities. In an embodiment, the semiconductor layer is p-type, the deep well region 24 is n-type, and the first well region 26 is n-type.

FIG. 3 illustrates the formation of a temporary insulation region 28 (step 704) in the top surface of the first well region 26. The temporary insulation region 28 may comprise a dielectric material, such as silicon dioxide, a high-density plasma (HDP) oxide, the like, or a combination thereof. In an embodiment, the temporary insulation region 28 is formed by a thermal oxidation process such that the temporary insulation region 28 consumes some of the material of the first well region 26. In an embodiment, the temporary insulation region 28 has a tapered or "beak" portion 28A. The tapered portion 28A allows for a large curvature of a P-N junction beneath a subsequently formed gate, as discussed further below. In some embodiments, a mask (not shown) may be formed over the semiconductor layer 22 and a portion of the first well region 26 to allow the tapered portion 28A of the temporary insulation region 28 to be inset a distance $D_1$ from an edge of the first well region 26. In an embodiment, the distance $D_1$ is from about 0.15 um to about 1 um.

Figure 4:
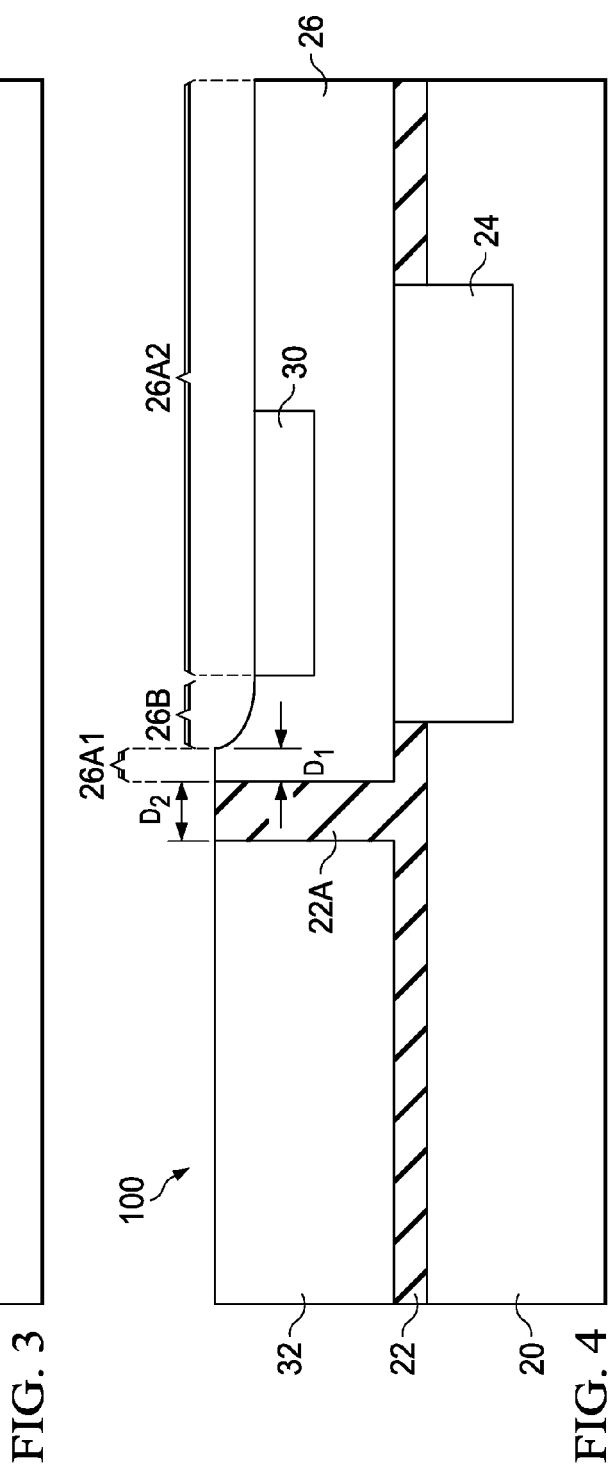

FIG. 4 illustrates the removal of the temporary insulation region 28 (step 706) and the formation of a depletion region 30 and a second well region 32. The temporary insulation region 28 is removed which removes the consumed portion of the first well region 26 and causes the first well region 26 to have a recessed top surface 26A2. The first well region 26 has a first top surface 26A1 which is substantially planar with the top surface of the semiconductor layer 22. The first well region 26 also has the recessed top surface 26A2 which will be referred to as a second top surface 26A2 hereinafter. The second top surface 26A2 is lower than the first top surface 26A1 because of the removal of the portion of the first well region 26 consumed by the removed temporary insulation region 28. The first well region 26 also has a curved top surface 26B which is between the first top surface 26A1 and the second top surface 26A2. The curved top surface 26B is formed by removal of the tapered or "beak" portion 28A of the temporary insulation region 28.

In another embodiment, the second (recessed) top surface 26A2 and the curved top surface 26B are formed by masking the top surface of the first well region 26 and performing an isotropic dry etch on the exposed portions of the first well region 26. In this embodiment, the formation and removal of the temporary insulation region 28 is not necessary but may be performed after the isotropic dry etch process to further recess the second top surface 26A2.

A depletion region 30 may be formed in the second top surface 26A2 (step 708). The depletion region 30 may be formed by masking the first well region 26, for example, with a photoresist (not shown), and performing an implantation process to form the depletion region 30. The depletion region 30 may be doped with p-type or n-type impurities. The depletion region 30 may be doped opposite of the first well region 26 to allow a portion of the first well region 26 to be fully depleted and thus increase the breakdown voltage. In an embodiment, the first well region 26 is n-type, and the depletion region 30 is p-type.

A second well region 32 may be formed (step 710) in the top surface of the semiconductor layer 22 laterally spaced from the first well region by a distance $D_2$. In an embodiment, the distance $D_2$ is from about 0.5 um to about 3 um. A portion 22A of the semiconductor layer 22 is laterally between the first well region 26 and the second well region 32. The second well region 32 may be formed by masking the semiconductor layer 22, for example, with a photoresist (not shown), and performing an implantation process to form the second well region 32. The second well region 32 may be doped with p-type or n-type impurities. In some embodiments, the second well region 32 and the depletion region 30 are formed at a same time by a same implantation process. In an embodiment, the second well region 32 is p-type, and the depletion region 30 is p-type. In some embodiments, the first well region 26 and the second well region 32 are formed to have a dopant concentration from about $1\times10^{14}$ cm$^{-3}$ to about $1\times10^{17}$ cm$^{-3}$, the depletion region 30 is formed to have a dopant concentration from about $1\times10^{15}$ cm$^{-3}$ to about $1\times10^{18}$ cm$^{-3}$, and the portion 22A is formed to have a dopant concentration from about $1\times10^{13}$ cm$^{-3}$ to about $1\times10^{16}$ cm$^{-3}$.

By separating the first well region 26 and the second well region 32, the breakdown voltage of the subsequently formed UHV LDMOS transistor 150 (see FIG. 6) is improved because portion 22A of the semiconductor layer 22 between the first well region 26 and the second well region 32 has a higher resistance which lowers the electric field in the portion 22A and allows for the electric field to be better released between the first well region 26 and the second well region 32.

In some embodiments, the steps of forming the temporary insulation region 28 and removing the temporary insulation region 28 (steps 704 and 706) may be repeated to form a longer curved top surface 26B of the first well region 26. This longer curved top surface 26B may further improve the breakdown voltage of the UHV LDMOS transistor 150 (see FIG. 6). In an embodiment wherein the steps 704 and 706 are performed twice, the breakdown voltage of the subsequently formed UHV LDMOS transistor is about 20 V higher than if the steps 704 and 706 are performed only once.

FIG. 5 illustrates the formation of an insulation region 34A on the depletion region 30 (step 712), an insulation region 34B in the second surface 26A2 of the first well region 26, and an insulation region 36 in the top surface of the second well region 32. A portion of the second surface 26A2 of the first well region 26 is laterally between the insulation regions 34A and 34B. This portion of the second surface 26A2 of the first well region 26 will allow the formation of a drain region 42 in the first well region (see FIG. 6). Further, the insulation regions 34A and 34B have top surfaces which are lower than a top surface of the insulation region 36 because they are formed on the second surface 26A2 of the first well region 26 which is lower than the top surface 32A of the second well region 32 on which the insulation region 36 is formed. The insulation regions 34A, 34B, and 36 may comprise a dielectric material, such as silicon dioxide, a high-density plasma (HDP) oxide, the like, or a combination thereof. In an embodiment, the insulation regions 34A and 34B are formed by a thermal oxidation process such that the insulation regions 34A consumes some of the material of the depletion region 30 and first well region 26 and the insulation region 34B consumes some of the material of the first well region 26. The insulation region 36 may also be formed by a thermal oxidation process such that the insulation region 36 consumes some of the material of the second well region 32. In an embodiment, the insulation regions 34A, 34B, and 36 are formed at a same time and by a same process. In another embodiment, the insulation regions 34A, 34B, and 36 are formed at different times and by different processes.

FIG. 6 illustrates the formation of a gate 38, gate spacers 40, source regions 46 and 44, and a drain region 42 (step 714) to form a UHV LDMOS transistor 150. The gate 38 is formed partially over the second well region 32, the semiconductor layer 22 (portion 22A), the first well region 26, and the insulation region 34A. The gate 38 may include a gate dielectric layer (not shown). The gate dielectric layer may be formed by thermal oxidation, chemical vapor deposition (CVD), sputtering, or any other methods known and used in the art for forming a gate dielectric. In some embodiments, the gate dielectric layer includes dielectric materials having a high dielectric constant (k value), for example, greater than 3.9. The gate dielectric materials include silicon nitrides, oxynitrides, metal oxides such as $HfO_2$, $HfZrO_x$, $HfSiO_x$, $HfTiO_x$, $HfAlO_x$, the like, or combinations and multi-layers thereof.

The gate electrode layer (not shown) may be formed over the gate dielectric layer. The gate electrode layer may comprise a conductive material and may be selected from a group comprising polycrystalline-silicon (poly-Si), poly-crystalline silicon-germanium (poly-SiGe), metallic nitrides, metallic silicides, metallic oxides, and metals. In one embodiment, amorphous silicon is deposited and recrystallized to create polycrystalline silicon (poly-silicon). The gate electrode layer may be deposited by physical vapor deposition (PVD), CVD, sputter deposition, or other techniques known and used in the art for depositing conductive materials. The top surface of the gate electrode layer usually has a non-planar top surface, and may be planarized prior to patterning of the gate electrode layer or gate etch. Ions may or may not be introduced into the gate electrode layer at this point. Ions may be introduced, for example, by ion implantation techniques.

The gate spacers 40 are formed on opposite sides of the gate 38. The gate spacers 40 are formed by blanket depositing a spacer layer (not shown) on the previously formed gate 38. In an embodiment, the gate spacers 40 include a spacer liner (not shown). The spacer liner may be made of SiN, SiC, SiGe, oxynitride, oxide, the like, or a combination thereof. The spacer layer may comprise SiN, oxynitride, SiC, SiON, oxide, combinations thereof, or the like and may be formed by methods utilized to form such a layer, such as CVD, plasma enhanced CVD (PECVD), low pressure CVD (LPCVD), atomic layer deposition (ALD), sputter, the like, or a combination thereof. The gate spacers 40 are then patterned, for example, by an anisotropic etch to remove the spacer layer from the horizontal surfaces of the gate 38.

After the gate spacers 40 are formed, the source regions 44 and 46 and the drain region 42 are formed. The source regions 44 and 46 are formed in the second well region 32, and the drain region 42 is formed in the first well region 26. The source regions 44 and 46 are laterally between the gate 38, and the insulation region 36 and the drain region 42 is laterally between the insulation regions 34A and 34B. The source regions 46 and 44 and the drain regions 42 may be formed by more than one implantation process. In an embodiment, the source region 46 is formed by first implantation process and the source region 44 and drain region 42 are both formed by a second implantation process, although, in other embodiments, the order of implantation steps may be reversed. In some embodiments, the source region 46 is p-type, and the source region 44 and the drain region 42 are n-type.

In an embodiment wherein the UHV LDMOS transistor 150 is an NMOS transistor, the semiconductor layer 22 is p-type, the first well region 26 is n-type, the depletion region is p-type, the second well region is p-type, the drain region 42 is n-type, the source region 44 is n-type, and the source region 46 is p-type. Another embodiment would be a PMOS transistor with the doping of the regions being reversed (e.g. p-type instead of n-type, and n-type instead of p-type). The formation of the PMOS embodiment is similar to the description above and the details are not repeated herein.

Figure 8:
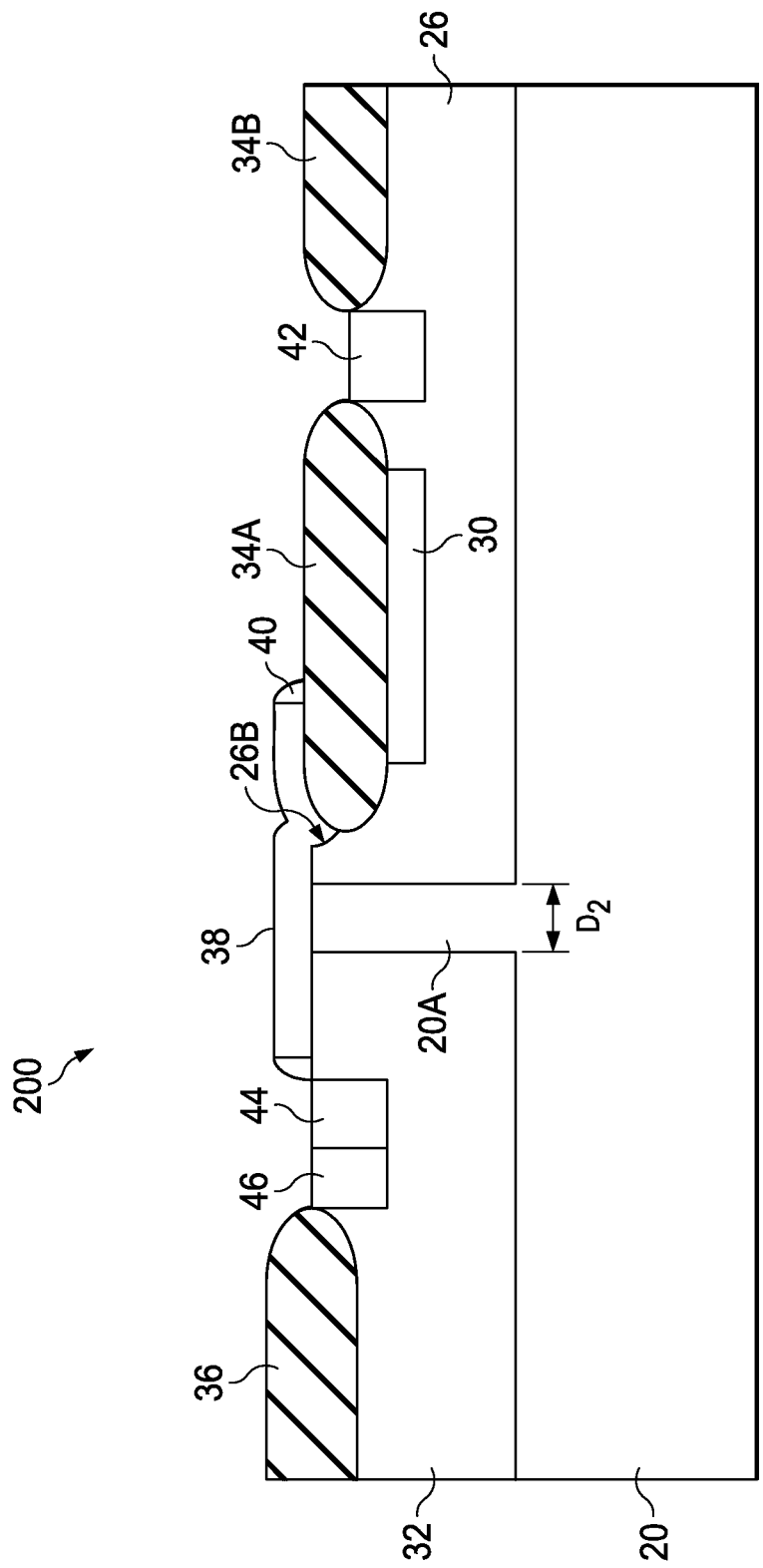
FIG. 8 illustrates a cross-sectional view of a semiconductor device according to an embodiment.

FIG. 8 illustrate an embodiment of a UHV LDMOS transistor 200 wherein the first well region 26 and the second well region 32 are separated by a portion 20A of the substrate 20. In this embodiment, the first well region 26 and the second well region 32 are formed in the substrate 20 and not in the semiconductor layer 22 as in the previous embodiment. This embodiment may be formed of similar materials and by similar processes as the previous embodiments and the details of those materials and processes will not be repeated herein.

By separating the first well region and the second well region, the breakdown voltage of the UHV LDMOS transistor is improved. The breakdown voltage is improved because portion of the semiconductor layer or substrate between the first well region and the second well region has a higher resistance than the first well region and the second well region. This higher resistance in the portion of the semiconductor layer or substrate causes a higher potential difference and also lowers the electric field in that portion which allows for the electric field to be better released between the first well region and the second well region. Further, the large junction curvature of the first well region near the gate and the insulation region increases the electric field induced junction breakdown. Accordingly, the improved releasing of the electric field between the first well region and the second well region improves the breakdown voltage of the UHV LDMOS transistor.

An embodiment is a semiconductor device including a first well region of a first conductivity type in a top surface of a substrate, and a second well region of a second conductivity type in the top surface of the substrate. The second conductivity type being opposite the first conductivity type, and the second well region laterally separated from the first well region by a first portion of the substrate. The semiconductor device further includes a third region of the second conductivity type in the first well region, and a first field oxide region in the first well region. The first field oxide region having a first bottom surface on and directly contacting the third region. The semiconductor device further includes a second field oxide region in the second well region, the second field oxide region having a second bottom surface, the first bottom surface being lower than the second bottom surface.

Another embodiments is an ultra-high voltage (UHV) laterally-diffused metal-oxide-semiconductor (LDMOS) transistor including a first well region of a first conductivity type in a top surface of a substrate, and a second well region of a second conductivity type in the top surface of the substrate, the second well region being laterally separated from the first well region by a first distance. The transistor further includes a drain region in the first well region, and a source region in the second well region, the source region having a top surface higher than a top surface of the drain region. The transistor further includes a first insulation region on the first well region, the first insulation region being laterally between the drain region and the second well region, and a gate on a portion of the second well region, a portion of the first well region, and a portion of the first insulation region, a portion of the gate extending below a first top surface of the first well region.

A further embodiment is a method of forming a semiconductor device, the method including forming a first well region of a first conductivity type in a top surface of a substrate, and forming a first field oxide region in a top surface of the first well region, the first field oxide region extending into the first well region, the first field oxide region being laterally separated from a first edge of the first well region by a first distance. The method further includes removing the first field oxide region, the removing forming a first recessed top surface of the first well region, the first recessed top surface being lower than a top surface of the first well region at the first edge, and forming a second field oxide region in the first recessed top surface of the first well region. The method further includes forming a second well region of a second conductivity type in the top surface of the substrate, the second well region being laterally separated from the first edge of the first well region by a first portion of the substrate, and forming a gate on the second well region, the first portion of the substrate, the first well region, and the second field oxide region, the gate having a portion below the top surface of the first well region.

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device comprising:
    a first well region of a first conductivity type in a top surface of a substrate, the top surface of the substrate comprising a curved surface;
    a second well region of a second conductivity type in the top surface of the substrate, the second conductivity type being opposite the first conductivity type, the second well region laterally separated from the first well region by a first portion of the substrate;
    a first field oxide region in the first well region, the first field oxide region having a first bottom surface, wherein the first field oxide region directly contacts a lower portion of the curved surface of the substrate;
    a second field oxide region in the second well region, the second field oxide region having a second bottom surface, the first bottom surface being lower than the second bottom surface; and
    a gate on the first well region and the second well region, wherein a portion of the gate fills a gap between the first field oxide region and an upper portion of the curved surface of the substrate.

2. The semiconductor device of claim 1, wherein the first well region comprises:
    a first top surface adjacent the first portion of the substrate, the first top surface being coplanar with a top surface of the first portion of the substrate;
    a second top surface adjacent the first field oxide region, the second top surface being lower than the first top surface; and
    a third top surface between the first top surface and the second top surface, the third top surface being non-perpendicular and non-parallel with a top surface of the second well region.

3. The semiconductor device of claim 2, wherein the gate comprises:
    a gate dielectric layer on the top surface of the second well region, the top surface of the first portion of the substrate, the first top surface of the first well region, the third top surface of the first well region, and a top surface of the first field oxide region;
    a gate electrode on the gate dielectric layer, wherein a portion of the gate electrode is below the first top surface of the first well region; and
    gate spacers on opposite sides of the gate electrode.

4. The semiconductor device of claim 2, where the first top surface of the first well region extends a first distance from the first portion of the substrate to the third top surface, the first distance being from about 0.15 um to about 1 um.

5. The semiconductor device of claim 1, wherein the first portion of the substrate extends a second distance from the first well region to the second well region, the second distance being from about 0.5 um to about 3 um.

6. The semiconductor device of claim 1, wherein the first conductivity type is n-type and the second conductivity type is p-type.

7. An ultra-high voltage (UHV) laterally-diffused metal-oxide-semiconductor (LDMOS) transistor comprising:
    a first well region of a first conductivity type in a top surface of a substrate, the first well region having a first top surface and a second top surface, the second top surface being lower than the first top surface, wherein the first top surface and the second top surface are connected by a curved surface;
    a second well region of a second conductivity type in the top surface of the substrate, the second well region being laterally separated from the first well region by a first distance;
    a drain region in the first well region;
    a source region in the second well region, the source region having a top surface higher than a top surface of the drain region;
    a first insulation region on the first well region, the first insulation region being laterally between the drain region and the second well region, wherein the first insulation region is in direct contact with a lower portion of the curved surface; and
    a gate on a portion of the second well region, a portion of the first well region, and a portion of the first insulation region, wherein a portion of the gate extends below the first top surface of the first well region and is in direct contact with an upper portion of the curved surface, and wherein the portion of the gate does not extend below the top surface of the drain region.

8. The transistor of claim 7 further comprising a third region of the second conductivity type in the first well region, the first insulation region directly contacting a top surface of the third region.

9. The transistor of claim 7, wherein the source region further comprises a first region of the first conductive type and a second region of the second conductivity type, the first region being adjacent and contacting the second region, the first region being between the second region and the gate.

10. The transistor of claim 7, wherein the first distance is from about 0.5 um to about 3 um.

11. The transistor of claim 7, wherein the substrate further comprises an epitaxial layer of the second conductivity type on the substrate, the first well region and the second well region being formed in the epitaxial layer, and the epitaxial layer extending between the first well region and the second well region.

12. The transistor of claim 7, wherein the first conductivity type is n-type and the second conductivity type is p-type.

13. A method of forming a semiconductor device, the method comprising:
forming a first well region of a first conductivity type in a top surface of a substrate;
forming a first field oxide region in a top surface of the first well region, the first field oxide region extending into the first well region, the first field oxide region being laterally separated from a first edge of the first well region by a first distance;
removing the first field oxide region, the removing forming a first recessed top surface of the first well region, the first recessed top surface being lower than a top surface of the first well region at the first edge;
forming a second field oxide region in the first recessed top surface of the first well region;
forming a second well region of a second conductivity type in the top surface of the substrate, the second well region being laterally separated from the first edge of the first well region by a first portion of the substrate; and
forming a gate on the second well region, the first portion of the substrate, the first well region, and the second field oxide region, the gate having a portion below the top surface of the first well region, wherein the gate does not extend lower than the first recessed top surface.

14. The method of claim 13 further comprising:
forming a drain region in the first well region, the drain region being adjacent the second field oxide region; and
forming a source region in the second well region, the source region having a top surface higher than a top surface of the drain region.

15. The method of claim 13 further comprising:
before forming the second field oxide region, forming a third region of the second conductivity type in the first well region, the second field oxide being formed directly on the third region.

16. The method of claim 13 further comprising:
removing the second field oxide region, the removing forming a second recessed top surface of the first well region, the second recessed top surface being lower than the first recessed top surface; and
forming a third field oxide region in the second recessed top surface, the gate being formed on the third field oxide region.

17. The method of claim 13, wherein the first portion of the substrate extends a second distance from the first well region to the second well region, the second distance being from about 0.5 um to about 3 um.

18. The method of claim 13 further comprising forming a third field oxide region in the second well region, the third field oxide region having a top surface higher than a top surface of the second field oxide region.

19. The method of claim 13, wherein the first conductivity type is n-type and the second conductivity type is p-type.

20. The semiconductor device of claim 3, wherein the gate does not extend lower than the second top surface.

* * * * *